(12) United States Patent
Cohen (10) Patent No.: US 11,381,224 B2
(45) Date of Patent: Jul. 5, 2022

(54) CLOCKLESS PROGRAMMABLE PULSE WIDTH GENERATION USING AN INVERSE CHAOTIC MAP

(71) Applicant: Seth D. Cohen, Birmingham, AL (US)

(72) Inventor: Seth D. Cohen, Birmingham, AL (US)

(73) Assignee: SOUTHERN RESEARCH INSTITUTE, Birmingham, AL (US)

( * ) Notice: Subject to any disclaimer, the term of this patent is extended or adjusted under 35 U.S.C. 154(b) by 0 days.

(21) Appl. No.: 16/972,921

(22) PCT Filed: Jun. 10, 2019

(86) PCT No.: PCT/US2019/036371
§ 371 (c)(1),
(2) Date: Dec. 7, 2020

(87) PCT Pub. No.: WO2019/237114
PCT Pub. Date: Dec. 12, 2019

(65) Prior Publication Data
US 2021/0250018 A1 Aug. 12, 2021

Related U.S. Application Data

(60) Provisional application No. 62/682,699, filed on Jun. 8, 2018.

(51) Int. Cl.
*H03K 3/017* (2006.01)
*H03K 3/037* (2006.01)
(Continued)

(52) U.S. Cl.
CPC ............. *H03K 3/017* (2013.01); *H03K 3/037* (2013.01); *H03K 19/177* (2013.01); *H03K 19/20* (2013.01); *H03M 1/504* (2013.01); *H03M 7/00* (2013.01)

(58) Field of Classification Search
USPC .................. 341/157, 343, 144, 152, 143
See application file for complete search history.

(56) References Cited

U.S. PATENT DOCUMENTS 4,318,183 A 3/1982 Byington et al.
4,321,547 A 3/1982 Pickard et al.
(Continued)

OTHER PUBLICATIONS

Abid, A et al. "Implementation of a Chaotically Encrypted Wireless Communication System" [online publication] IEEE; Jul. 2009 [retrieved online Jul. 8, 2019] <URL: http://citeseerx.istpsu.edu/viewdoc/download? doi=10.1.1.888.9660&rep=rePI&type=pdf> DOI: 10.1109/ICC.2009.5199069; fourth page, first column.
(Continued)

*Primary Examiner* — Amy Cohen Johnson
*Assistant Examiner* — James H Cho
(74) *Attorney, Agent, or Firm* — Ballard Spahr LLP (57) ABSTRACT

Technologies are provided for generation of programmable pulse signals using inverse chaotic maps, without reliance on a clocking signal. Some embodiments of the technologies include an apparatus that can receive a sequence of bits having a defined number of bits, where the sequence of bits represent a desired continuous pulse signal having a programmable width in time-domain. The apparatus can also can receive a precursor continuous pulse signal having an arbitrary width in time-domain that fits within the dynamic range of the apparatus. The apparatus can generate the desired continuous pulse signal by transforming the precursor continuous pulse signal using the sequence of bits and an inverse chaotic map.

20 Claims, 7 Drawing Sheets

(51) Int. Cl.
  *H03K 19/177* (2020.01)
  *H03K 19/20* (2006.01)
  *H03M 1/50* (2006.01)
  *H03M 7/00* (2006.01)

(56) References Cited

U.S. PATENT DOCUMENTS

| | | | |
|---|---|---|---|
| 4,551,816 A | 11/1985 | Hyatt | |
| 4,581,715 A | 4/1986 | Hyatt | |
| 4,944,036 A | 7/1990 | Hyatt | |
| 5,426,433 A | 6/1995 | Gertel | |
| 5,517,155 A | 5/1996 | Yamauchi et al. | |
| 5,774,084 A | 6/1998 | Brombaugh et al. | |
| 5,805,094 A | 9/1998 | Roach et al. | |
| 6,504,427 B2 | 1/2003 | Midya et al. | |
| 6,507,177 B2 | 1/2003 | Flock et al. | |
| 7,457,291 B2 | 11/2008 | Lee et al. | |
| 7,613,212 B1 | 11/2009 | Raz et al. | |
| 7,782,017 B2 | 8/2010 | Hack et al. | |
| 7,844,796 B2 | 11/2010 | Vorbach et al. | |
| 8,174,293 B2 | 5/2012 | Yoshihara et al. | |
| 8,325,076 B2 | 12/2012 | Yousif et al. | |
| 10,218,343 B1 | 2/2019 | Tomar et al. | |
| 2002/0080889 A1 | 6/2002 | Dress, Jr. et al. | |
| 2002/0191690 A1* | 12/2002 | Pendergrass | H04L 25/4902 |
| | | | 375/239 |
| 2004/0177310 A1 | 9/2004 | Mohan et al. | |
| 2005/0036479 A1* | 2/2005 | Lee | H04B 1/71632 |
| | | | 370/350 |
| 2006/0088081 A1* | 4/2006 | Withington | H04B 1/7172 |
| | | | 375/130 |
| 2007/0040608 A1 | 2/2007 | Magrath et al. | |
| 2007/0110125 A1 | 5/2007 | Fujita et al. | |
| 2007/0291833 A1* | 12/2007 | Shimanskiy | H03K 7/08 |
| | | | 375/238 |
| 2010/0164806 A1 | 7/2010 | Pillai | |
| 2010/0244958 A1 | 9/2010 | Tsuji et al. | |
| 2012/0068781 A1* | 3/2012 | Pfaffinger | H03K 7/08 |
| | | | 332/109 |
| 2012/0268105 A1 | 10/2012 | Mann et al. | |
| 2013/0015992 A1* | 1/2013 | Horio | H03M 1/0692 |
| | | | 341/143 |
| 2013/0057423 A1 | 3/2013 | Kurchuk et al. | |
| 2015/0041625 A1 | 2/2015 | Dutton et al. | |
| 2019/0271959 A1 | 9/2019 | Firu et al. | |

OTHER PUBLICATIONS

International Search Report and Written Opinion issued in application No. PCT/US2019/036371 dated Sep. 16, 2019.
Cohen, S.D. et al., "A pseudo-matched filter for chaos," Chaos, 2012, pp. 1-10, vol. 22, issue 033148, American Institute of Physics.
Cohen, Seth D., "Structured scale-dependence in the Lyapunov exponent of a Boolean chaotic map," 2015.
Rosin, D.P. et al., "Experiments on autonomous Boolean networks," Chaos, 2013, pp. 1-9, vol. 23, issue 025102, AIP Publishing LLC.
Rosin, D.P. et al., "Ultrafast physical generation of random numbers using hybrid Boolean networks," Physical Review E, 2013, pp. 1-4, vol. 87, issue 040902(R), American Physical Society.
Tsividis, Y., "Event-Driven Data Acquisition and Digital Signal Processing—A Tutorial," IEEE Transactions on Circuits and Systems-II: Express Briefs, 2010, pp. 577-581, vol. 57, issue 8, IEEE.
Turin, G.L., "An Introduction to Digital Matched Filters," Proceedings of the IEEE, 1976, pp. 1092-1112, vol. 64, Issue 7, IEEE.
Zhang, R. et al., "Boolean chaos," Physical Review E, 2009, pp. 1-4, vol. 80, issue 045202(R), The American Physical Society.
Zhang, R. et al., "Boolean Chaos," nlin.cd, 2009.
Interational Search Report and Written Opinion issued in related application PCT/US2019/036372 dated Oct. 28, 2019.

* cited by examiner

CLOCKLESS PROGRAMMABLE PULSE WIDTH GENERATION USING AN INVERSE CHAOTIC MAP

CROSS-REFERENCE TO RELATED APPLICATION

This application is a national stage filing under 35 U.S.C. § 371 of International Application No. PCT/US2019/036371, filed on Jun. 10, 2019, which claims the benefit of U.S. Provisional Patent Application No. 62/682,699, filed Jun. 8, 2018, the content of which is hereby expressly incorporated by reference herein in its entireties.

BACKGROUND

Clockless manipulation of continuous signals in the time-domain refers to operations that modify the signals without reliance on a clocking signal providing time reference. Although some conventional techniques for generation of pulses with programmable widths in the time-domain are available, these techniques rely on discretized time units such as a clock or ring oscillator with a counter component. In such techniques, a pulse rising edge can be generated and the ring oscillator can begin to produce a square waveform, where the counter tracks the periods of the ring oscillator and a pulse falling edge is generated after a finite number of periods is observed. Thus, this counter can only measure the oscillations in a discrete time step. In addition, the implementation of this type of clocked or ring oscillator technique requires fast switching, which, in turn, requires a substantial amount of source current. There are existing methods to augment the resolution of such clocked systems, however, pulse widths generated with these types of techniques are still discretized to integer multiples of some oscillator's period. Therefore, much remains to be improved in clockless generation of pulse signals having programmable widths in the time-domain.

SUMMARY

The technologies disclosed herein address, amongst other technical challenges, the issue of generation of pulse signals with defined or programmable widths without reliance on a clocking signal. Embodiments of the technologies disclosed herein provide programmable pulse generator (PPG) apparatuses and techniques that use continuous and clockless operations of inverse chaotic maps to produce target pulse signals having respective widths of a specified length. In one embodiment, the disclosure includes a method. The method including receiving a sequence of bits having a defined number of bits, the sequence of bits representing a target continuous pulse width of a signal having a first defined width in time-domain. The method also including receiving a precursor continuous pulse signal having a second defined width in time-domain. The method further including generating the target continuous pulse signal by transforming the precursor continuous pulse signal using the sequence of bits and an inverse chaotic map.

In another embodiment, the disclosure includes an apparatus. The apparatus including a component for receiving a sequence of bits having a defined number of bits, the sequence of bits representing a target continuous pulse signal having a first defined width in time-domain. The apparatus also including a component for receiving a precursor continuous pulse signal having a second defined width in the time-domain. The apparatus further including a component for generating the target continuous pulse signal by transforming the precursor continuous pulse signal using the sequence of bits and an inverse chaotic map.

In yet another embodiment, the disclosure includes an apparatus that includes processing circuitry configured to perform operations including receiving a sequence of bits having a defined number of bits, the sequence of bits representing a target continuous pulse width of a signal having a first defined width in time-domain. The operations also including receiving a precursor continuous pulse signal having a second defined width in time-domain. The operations further including generating the target continuous pulse signal by transforming the precursor continuous pulse signal using the sequence of bits and an inverse chaotic map.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The annexed drawings are an integral part of the disclosure and are incorporated into the present specification. The drawings illustrate examples of embodiments of the disclosure and, in conjunction with the description and claims, serve to explain, at least in part, various principles, features, or aspects of the disclosure. Some embodiments of the disclosure are described more fully below with reference to the drawings. However, various aspects and elements of the disclosure can be implemented in many different forms and should not be construed as being limited to the implementations set forth herein. Like numbers refer to like, but not necessarily the same or identical, elements throughout. The accompanying drawings can be briefly characterized as follows.

DETAILED DESCRIPTION

The disclosure recognizes and addresses, amongst other technical challenges, the issue of generation of pulse signals with defined or programmable widths without reliance on a clocking signal. Embodiments of the technologies disclosed herein provide programmable pulse generator (PPG) apparatuses and techniques that use continuous and clockless operations of inverse chaotic maps to produce target pulse signals having respective widths of a specified length. In sharp contrast to conventional technologies, the PPG apparatuses disclosed herein can control and output a logic signal or pulse of a specific width without the use of a clocking signal. The specific width can be defined externally, by a user, for example. The disclosed PPG apparatuses and techniques permit iteratively transforming a duration of a continuous logic signal by means of real-time pulse operations, resulting in a target pulse signal of a desired width in the time domain. The desired width can be specified with a particular resolution. Because the disclosed PPG apparatuses and techniques do not utilize clocking signals, the disclosed technologies are noise resilient and the precision of generated target pulse widths is not discretized to a period of an oscillator.

As is described in greater details below, the disclosed PPG apparatuses and techniques utilize a relationship between modular functions and chaotic maps. A digital sequence of 1s and 0s is used to shape a precursor pulse signal to have a desired width w. The precursor pulse signal has a defined width that is iteratively transformed using an inverse chaotic map, where an input binary sequence determines which branch of the inverse chaotic map is active. The number of bits contained in the digital sequence permit a counter component to determine when the target pulse has the desired width w.

Embodiments of the disclosed technologies can be implemented in fully-electronic assemblies, including transistors; CMOS logic gates; field programmable gate-arrays (FPGAs); application-specific integrated circuits (ASICs); a combination of the foregoing; or similar. Assemblies that include FPGAs are highly practical platform for implementing the principles of this disclosure because, amongst other things, FPGAs are reconfigurable and can be implemented/updated using software only.

Other embodiments of the technologies can be implemented in numerous physical systems, such as optical systems, opto-electronic systems, or acoustic systems, where the logic signals can be present in either a physical medium (electromagnetic waves, pressure waves, etc.) or in the electronic elements used to measure such signals. Yet other embodiments of the disclosed technologies can be implemented in hybrid systems that combine electronic logic elements with other physical representations.

Figure 1:
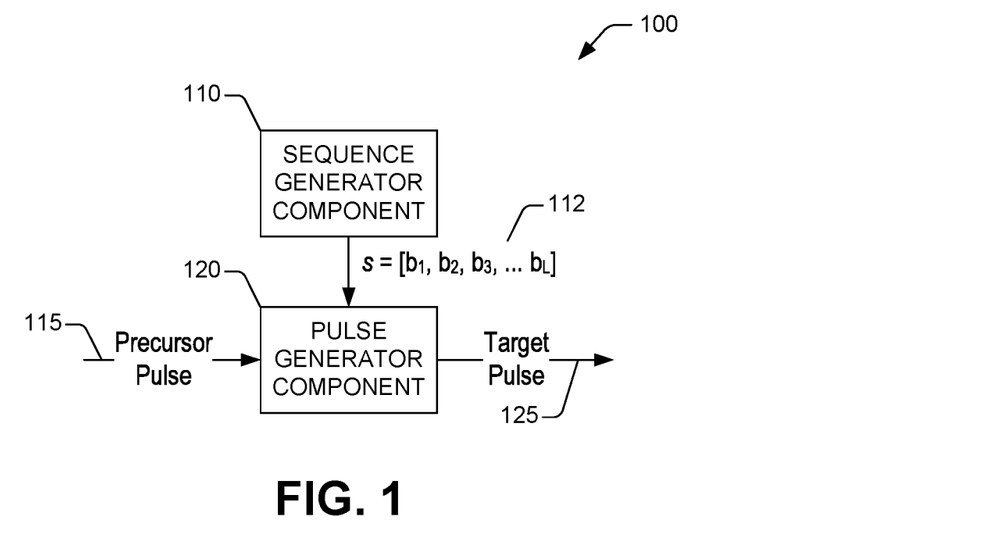
FIG. 1 illustrates an example of an apparatus that generates a continuous pulse signal having a programmable pulse width in time domain, in accordance with one or more embodiments of this disclosure.

With reference to the drawings, FIG. 1 illustrates an example of a programmable pulse generator (PPG) apparatus 100 that generates a continuous pulse signal having a programmable pulse width in time-domain, in accordance with one or more embodiments of this disclosure. The PPG apparatus 100 can utilize continuous and clockless operations of inverse chaotic maps to produce pulse widths having a configurable length in the time-domain. As such, the PPG apparatus 100 can control and output a continuous logic signal or pulse of defined width in the time-domain without reliance on a clock device or clock signal. The defined width can be configured to have a desired magnitude, with a defined resolution.

To that end, the PPG apparatus 100 includes a pulse generator component 120 that can receive a precursor continuous pulse signal 115 (referred to as precursor pulse 115) having an initial width $w_0$ in time-domain. Here, $w_0$ can be expressed as a real number in units of time. The pulse generator component 120 can iteratively transform the initial width $w_0$ by performing real-time pulse operations. Such an iterative transformation can result in a target pulse signal 125 having a resulting width w. Here, w can be expressed as a real number in units of time. The resulting width w can be defined (or programmed), with a defined resolution, prior to iteratively operating on the precursor pulse 115. In some embodiments, the precursor pulse 115 represents a logic signal of duration $w_0$ and the target pulse 125 represents another logic signal of duration w.

It is noted that the initial width $w_0$ and the resulting width w need not satisfy any particular mutual relationship. The initial width $w_0$ serves to define, in part, the precursor pulse 115 to be iterative transformed to generate the target pulse 125.

The real-time pulse operations can be the output of an inverse chaotic map. The inverse chaotic map is a multi-valued function that operates on pulse widths. Thus, the pulse generator component 120 utilizes a binary input to determine such an output. Accordingly, the PPG apparatus 100 can include a sequence generator component 110 that produces a binary sequence s having a defined number L of bits: $s=[b_1, b_2, \ldots b_L]$. Here, $b_k$ (k=1, 2, ... L) represents the k-th bit value (1 or 0) in the binary sequence s. The defined number L determines the number of transformation iterations applied to the precursor pulse 115. As such, the sequence of bits s is an a priori representation of the target pulse 125, where a resolution of the width w is determined by the defined number L. Greater L results in greater number of iterations and, thus, a higher-resolution of the width w of the target pulse 125. The defined number L can be referred to as the bit depth or resolution of the pulse-width transformation process performed by the PPG apparatus 100.

The PPG apparatus 100 can be implemented to operate in any physical system (e.g., a non-simulated process). The precursor pulse 115 can be embodied in a wave propagating in a physical medium. The wave can be, for example, an electromagnetic wave or a pressure wave. The physical medium can in turn be a solid or a fluid that permits the propagation of such a wave. In some configurations, the precursor pulse 115 can be vacuum. The binary sequence s also can be embodied in, for example, a pulse train propagating in the physical medium. The pulse generator component 120 can include components that can receive the precursor pulse 115 and the binary sequence s, and can generate the target pulse 125 by implementing an inverse chaotic maps, in accordance with aspects described herein. In some embodiments, the target pulse 125 can be embodied in a wave that also can propagate in the physical medium. In other embodiments, the target pulse 125 can be embodied in an electronic signal propagating in solid-state circuitry.

Simply for the sake of illustration, an inverse chaotic map $M^{-1}(\bullet)$ that can be implemented by pulse generator component 120 is defined as following equation:

$$M^{-1}(w) = \begin{cases} \dfrac{w}{m}, & \text{for } s = 0 \\ \dfrac{w}{m} + c, & \text{for } s = 1 \end{cases}.$$

The argument of $M^{-1}$ is the width of a continuous pulse signal. In Eq. (1), for c=0.5, $M^{-1}$ is the inverse of a Bernoulli shift map, where s is the reverse bit stream of map's symbolic dynamics and m is slope of the chaotic map. For instance, for an inverse Bernoulli shift map with slope m=2, and a desired pulse width of approximately 0.7495 (arbitrary units), the sequence generator component can configure L to be equal to 10 and can further configure the binary sequence s to be s=[1 1 1 1 1 1 1 1 0 1]. The pulse generator component 120 can then process the precursor pulse 115 by iterating $w_{k+1}=M^{-1}(w_k)$ ten times from an arbitrary initial value $0<w_0<1$ of the precursor pulse 115. For each iteration of $M^{-1}$, the bit values $b_k$ in s are used in sequential order to select the appropriate branch of from the piecewise $M^{-1}$.

The PPG apparatus 100 can implement other inverse chaotic maps besides that defined in Eq. (1) and can be implemented by the PPG apparatus 100. An example of those other maps includes is an inverse chaotic tent having a first branch of values and a second branch of values—e.g., an inverse chaotic tent map or an inverse chaotic shift map. The binary sequence s determines one of the first branch or the second branch to be applied to input signal. Further, in some embodiments, the PPG apparatus 100 also can implement continuous chaotic maps instead of a multi-valued (i.e., piece-wise) one-dimensional chaotic map.

Figure 2A:
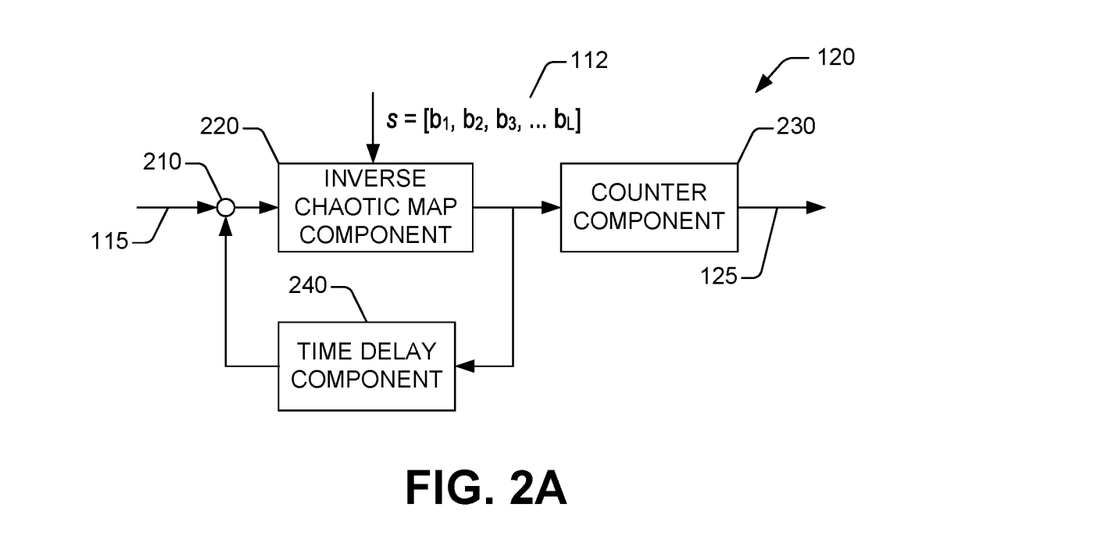
FIG. 2A illustrates an example of a pulse generator component, in accordance with one or more embodiments of this disclosure.

To implement the iterative transformation of the precursor pulse 115 via an inverse chaotic map (regardless of its form), the pulse generator component 120 can include an inverse chaotic map component 220 and a time delay component 240, as is shown in FIG. 2A.

Figure 2B:
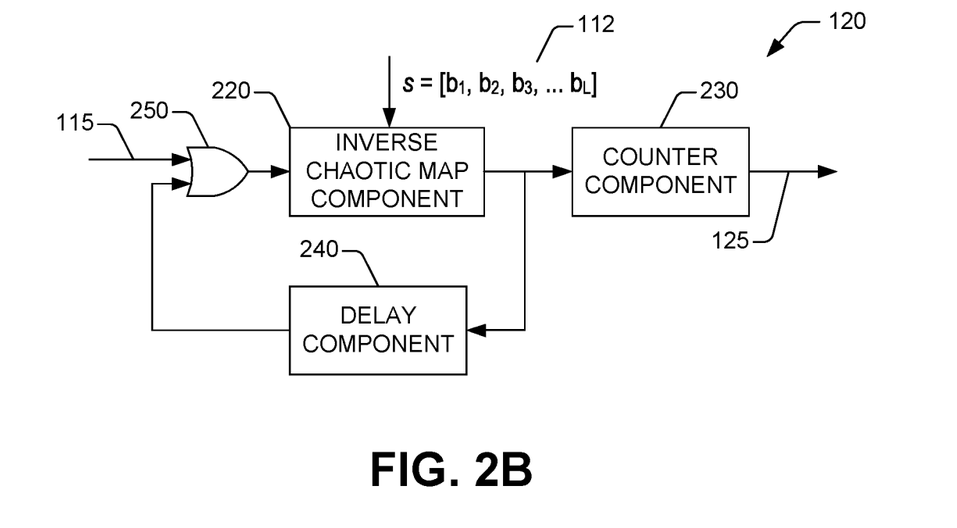
FIG. 2B illustrates another example of a pulse generator apparatus in accordance with one or more embodiments of this disclosure.

The inverse chaotic map component 220 can receive the binary sequence s and can iteratively transform the precursor pulse 115 by sequentially processing each bit in the sequence of bits s and a respective prior output signal from the inverse chaotic map component 220. In such processing, the time delay component 240 can delay, by an amount of time τ (that is larger than the iterated pulse widths), an output signal of the inverse chaotic map 220 for a particular bit (e.g., $b_k$) in the binary sequence s. The time delay component 240 can direct the delayed output signal to an ingestion component 210, to serve as an input signal in a next transformation iteration. Thus, the ingestion component 210 can supply the delayed output signal to the inverse chaotic map component 220 for processing of a next bit (e.g., $b_{k+1}$) in the binary sequence s. As is illustrated in FIG. 2B, in one configuration, the ingestion component 210 can be embodied in an OR gate 250. The delayed output signal from the time delay component 240 is received in an input terminal of the OR gate 250. An output terminal of the OR gate 250 supplies the delayed output signal to inverse chaotic map component 220, as a transformed input signal.

With further reference to FIG. 2A, the pulse generator component 120 also can include a counter component 230 that can update a counter identifying a number of rising (or falling) edges of output signals from the inverse chaotic map component 220. The counter component 230 can output the target pulse 125 in response to the counter having a value that is equal to L.

Figure 3:
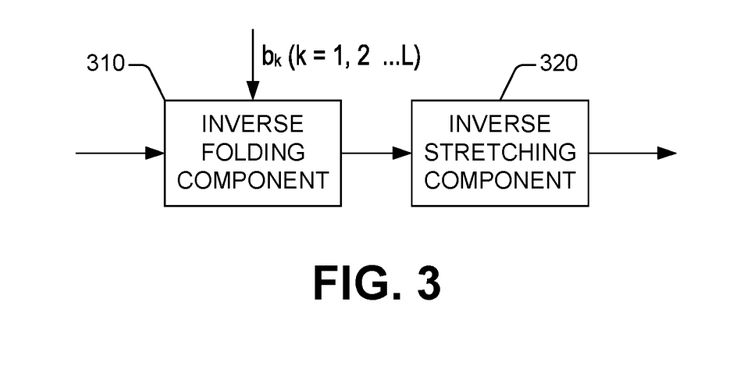
FIG. 3 illustrates an example of a component that implements an inverse chaotic map, in accordance with one or more embodiments of this disclosure.

FIG. 3 is a schematic block diagram of an example of the inverse chaotic map component 220, in accordance with one or more embodiments of this disclosure. For an inverse chaotic map $M^{-1}$, each transformation iteration $w_{k+1}=M^{-1}(w_k)$ of a prior transformation iteration $w_k$ can be determined as an inverse stretching function $g^{-1}(\bullet)$ applied to the output of an inverse folding function $f^{-1}(\bullet)$ (or vice versa) having as an argument $w_k$ and $b_{k+1}$. Namely, $w_{k+1}=M^{-1}(w_k)=g^{-1}(f^{-1}(w_k, b_{k+1}))$. In one embodiment, $$f^{-1}(w_k, b_{k+1}) = \begin{cases} w_k, & \text{for } b_{k+1} = 0 \\ w_k + \Delta, & \text{for } b_{k+1} = 1 \end{cases}$$

and $g^{-1}(w_k)=w_k/2$.

As is illustrated, the inverse chaotic map component 220 can include an inverse folding component 310 that can apply an inverse folding function to an input signal. The inverse chaotic map component 220 also can include an inverse stretching component 320 that applies an inverse stretching function to an output signal from the inverse folding component 310.

Figure 4:
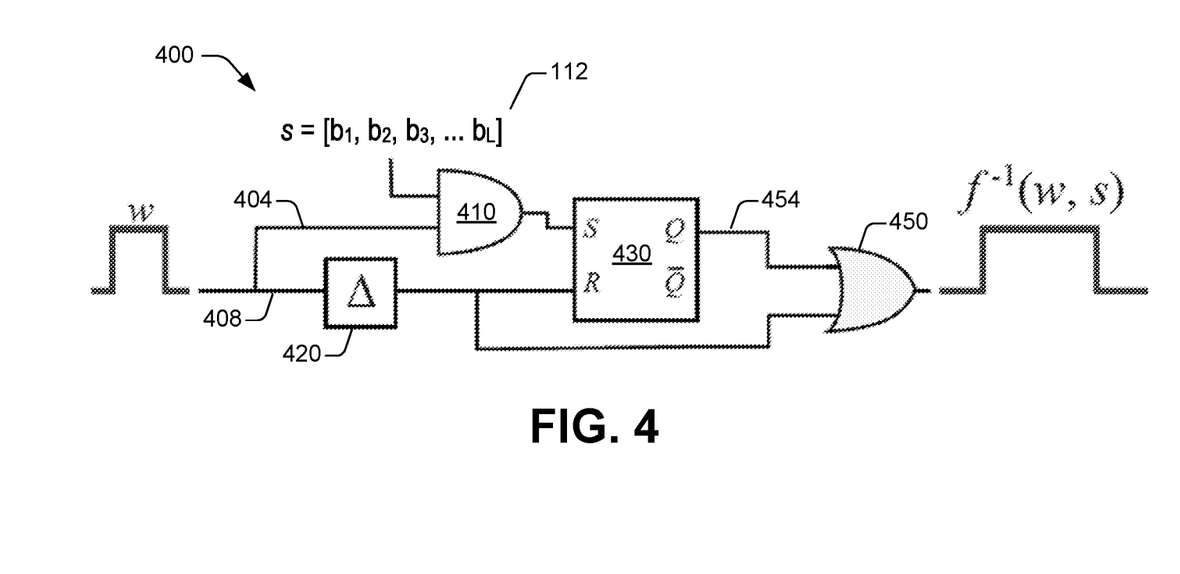
FIG. 4 illustrates an example of circuitry that constitutes a component of an inverse chaotic map, in accordance with one or more embodiments of this disclosure.

In some configurations, the inverse chaotic map component 220 can be embodied in, or can include, a field programmable gate array (FPGA) or an application-specific integrated circuit (ASIC), or a combination of both. As such, the inverse folding component 310 (FIG. 3) can be embodied in, or can include, digital circuitry 400 that can apply an inverse folding function to an input signal. FIG. 4 illustrates a schematic block diagram of an example of such circuitry. The digital circuitry 400 includes an AND gate 410 that receives first input signal 404. The AND gate 410 also receives the sequence of bits s. The first input signal 404 can be embodied in, for example, a continuous pulse signal having a width w. In one example configuration, the first input signal 404 corresponds to the precursor pulse 115 (e.g., a square pulse of width $w_0$). The digital circuitry also includes an SR-latch 430 coupled to output of the AND gate 410. The SR-latch 430 receives a second input signal 408 that corresponds to the first input signal 404 delayed by a defined amount of time Δ. A delay component 420 can delay the first input signal by Δ. Further, the digital circuitry also includes an OR gate 450 coupled to first output 454 of the SR-latch 430. In addition to receiving output signal 454 from the SR-latch 430, the OR gate 450 can receive the second input signal 408. Output of the OR gate 450 corresponds to a signal (e.g., a continuous pulse signal) having a width that is equal to inverse folding function $f^{-1}(\bullet)$ evaluated at w and s.

Figure 5A:
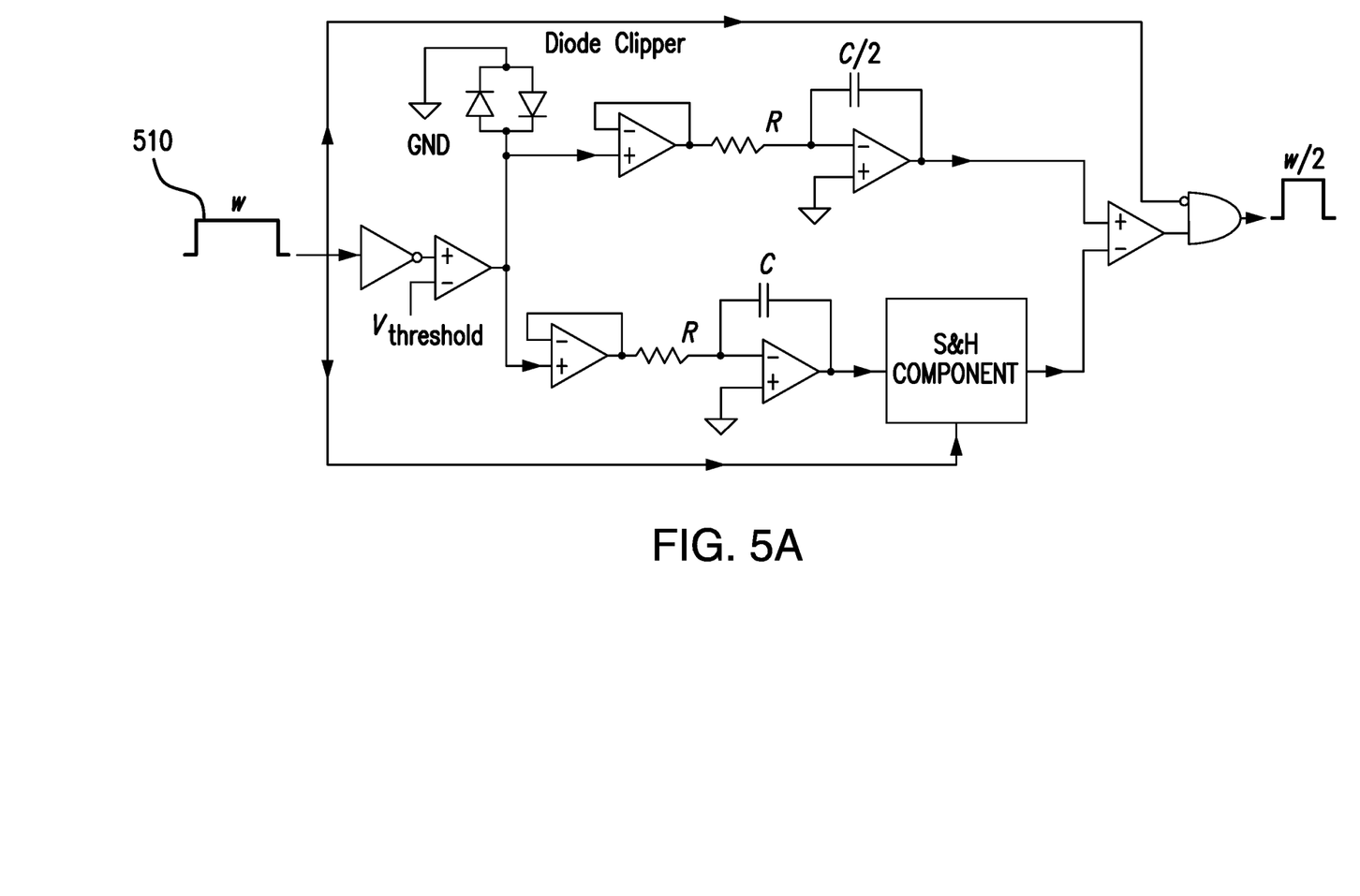
FIG. 5A illustrates another example of circuitry that constitutes a component of an inverse chaotic map, in accordance with one or more embodiments of this disclosure.

Further, continuing with reference to a configuration in which the inverse chaotic map component 220 can be embodied in, or can include, an FPGA or an ASIC, or a combination of both, the inverse stretching component 320 (FIG. 3) can be embodied in, or can include, digital circuitry 500 as is illustrated in FIG. 5A. The digital circuitry 500 includes a network of logic gates and can apply an inverse stretching function to an output signal 510 from the digital circuitry 400 (FIG. 4). For the sake of illustration, the output signal 510 is depicted as a square pulse 510 in time-domain having a defined amplitude and a width w. Results of the operations of the analog circuitry 160 are described and illustrated with reference to FIG. 5B. In the example arrangement shown in FIG. 5A, the digital circuitry 500 includes first integrator circuitry and second integrator circuitry. The first integrator circuitry can integrate the output signal 510 and can yield a time-dependent output signal 520 having a first defined slope, as is illustrated in FIG. 5B.

Figure 5B:
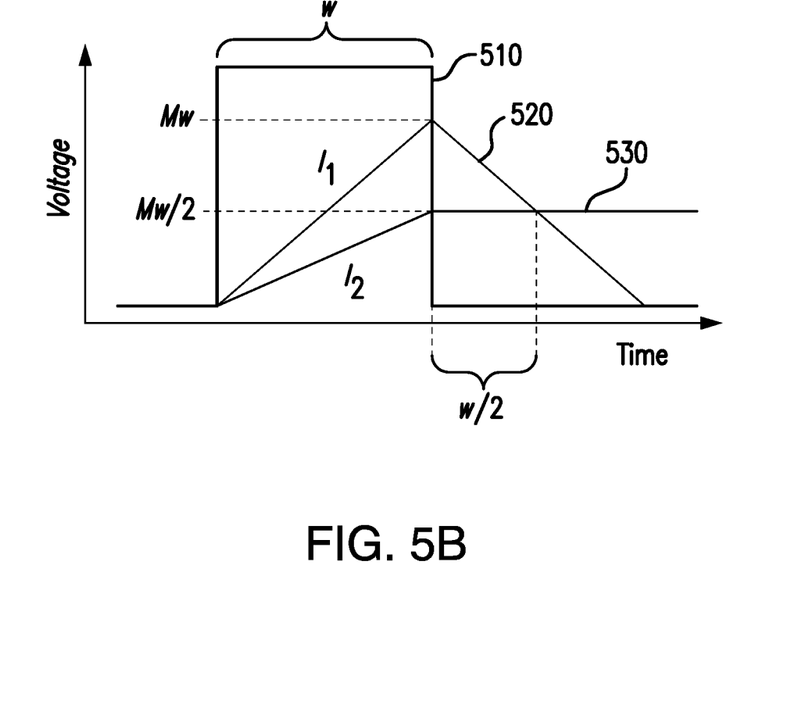
FIG. 5B illustrates an example of time-dependent signals resulting from the circuitry shown in FIG. 5A, in accordance with one or more embodiments of this disclosure.

The second integrator circuitry also can integrate the output signal 510 from the digital circuitry 400 and can yield a time-dependent output signal 530 having a second defined slope, as is illustrated in FIG. 5B. The first defined slope of the first integrator circuitry can be a multiple of the second defined slope.

The second integrator circuitry, however, can integrate the output signal 510 for a defined time interval. Upon the defined time interval elapses, a sample-and-hold (S&H)

component (FIG. 5A) can maintain output voltage of the second integrator circuitry constant. The S&H component can maintain the output voltage on a falling edge of the precursor pulse. As is shown in FIG. 5B, In instances in which the output signal is the square pulse 510, the defined time interval can correspond to the width w. FIG. 5B illustrates an example output signal 530 from the second integrator circuitry.

Continuing with such an example arrangement shown in FIG. 5A, the digital circuitry 500 also can include comparator circuitry to determine when the output signal 520 of the first integrator circuitry is less than the output signal 530 of the second integrator circuitry. As a result, in instances in which the output signal is the square pulse 510 (FIG. 5A), the comparator circuitry can output a pulse signal having a defined width w' corresponding to a ratio between the second defined slope and the first defined slope. FIG. 5B illustrates an example of output from the comparator circuitry for a ration equal to ½.

Figure 6:
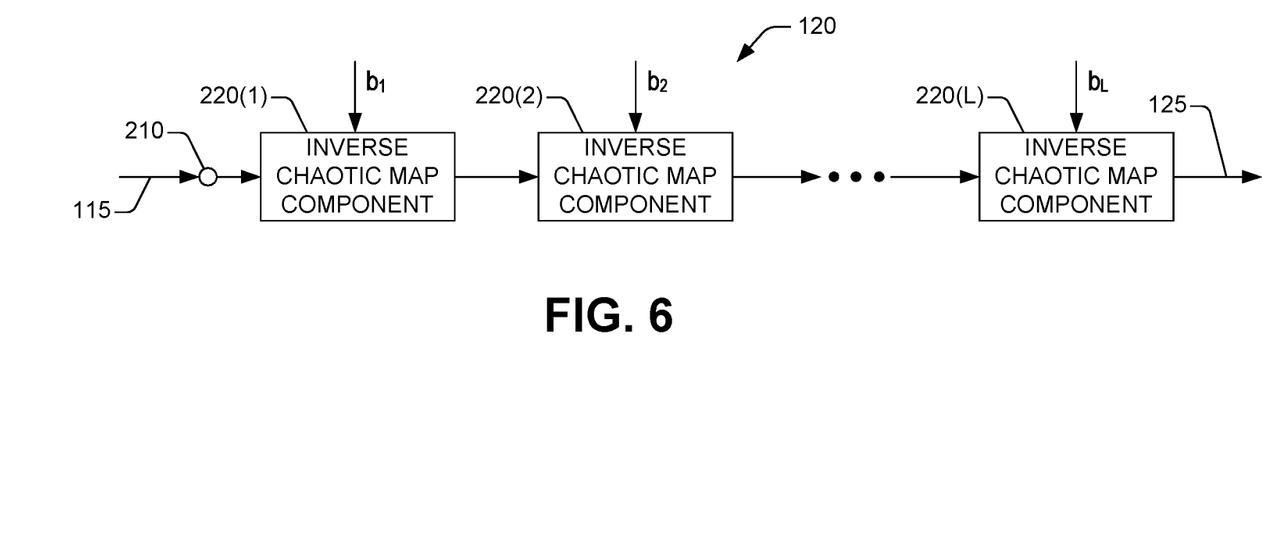
FIG. 6 illustrates an example of an apparatus that generates a pulse signal having a programmable pulse width in time domain, in accordance with one or more embodiments of this disclosure.

Although the pulse generator component 120 (FIG. 2) relies on a delay feedback loop to permit the iterative transformation of the precursor pulse 115, the disclosure is not so limited. In some embodiments, as is illustrated in FIG. 6, the pulse generation 120 can include L inverse chaotic components 220(1), 220(2), . . . 220(L) arranged in series. In such an embodiment, output signal from a first inverse chaotic component 220(k) is supplied to a second inverse chaotic component 220(k+1); here, 1≤k≤L Each inverse chaotic component 220 receives a bit from the binary sequence s in order to transform an input width according to a particular inverse chaotic map $M^{-1}$.

In some embodiments, rather than relying entirely on a single inverse chaotic map component 220 and a delay feedback look (see FIG. 2) or on a series of inverse chaotic map components 220, the pulse generator component 120 can include a combination of both multiple inverse chaotic map components and one or several delay feedback loops.

Figure 7:
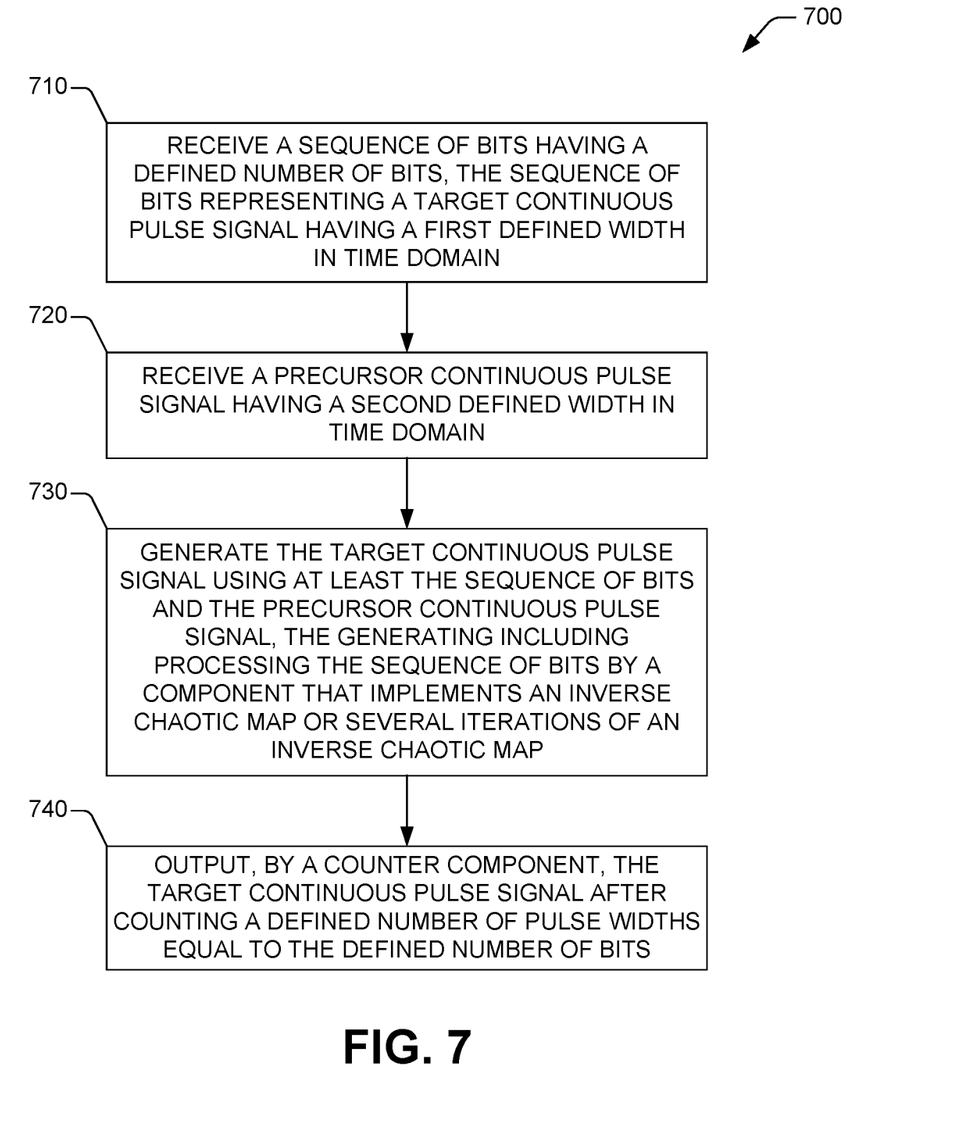
FIG. 7 illustrates an example of a method for generating a continuous pulse signal having a programmable pulse width in time domain, in accordance with one or more embodiments of this disclosure.

FIG. 7 illustrates one example of the techniques that emerge from the principles of this disclosure. While the exemplified methods are presented and described as a series of acts or operations that are performed in a sequence, the disclosure is not limited in that respect. Indeed, any one of the methods disclosed herein is not limited by the order (explicit or implied) of a specific sequence of acts or operations. For example, some acts or operations can occur in a different order than what is illustrated herein. In addition, an act or operation can occur concurrently with another act or operation. Further, in some instances, not all acts or operations may be required to implement a method or group of methods disclosed herein. In some embodiments, the acts or operations disclosed in connection with any of the methods in accordance with this disclosure may be machine-accessible instructions (e.g., machine-readable and/or machine-executable instructions) that can be executed or otherwise implemented by one or many processing devices and/or can be stored on a machine-readable storage medium, storage media, or storage circuitry. The processing devices including processing circuitry. In some configurations, the processing circuitry can include, or can be functionally coupled to storage circuitry.

Specifically, FIG. 7 is a flowchart of an example of a method 700 for generating a continuous pulse signal having a target width in time domain, in accordance with one or more embodiments of this disclosure. Such a target width can be specified prior to generating the target pulse signal. The example method 700 can be performed by an apparatus including multiple components assembled to generate the continuous pulse signal. The apparatus can include processing circuitry and storage circuitry in accordance with aspects of this disclosure. In some instances, the apparatus can be embodied in the PPG apparatus 100 (FIG. 1).

At block 710, the apparatus can receive a sequence of bits having a defined number of bits. The sequence of bits represents a target pulse signal having a first defined width in time domain. The target continuous pulse signal is represented with a precision determined by the defined number of bits. In one example, with reference to FIG. 1, the sequence of bits can be the sequence s and the first defined width can be the width WL.

At block 720, the apparatus can receive a precursor continuous pulse signal having a second defined width in time domain. The second defined width can be less than the first defined width. At block 730, the apparatus can generate the target continuous pulse signal using at least the sequence of bits and the precursor continuous pulse signal. The generating can include transforming that precursor continuous pulse signal by a component that implements an inverse chaotic map or several iterations of an inverse chaotic map. Transforming the precursor continuous pulse signal includes, in some embodiments, iteratively processing, by the component, by means of a delay component, each bit in the sequence of bits and a respective prior output signal from the component that implements the inverse chaotic map. Such a component includes, in some embodiments, first circuitry that applies an inverse folding function to an input signal, and second circuitry that applies an inverse stretching function to an output signal from the first circuitry.

At block 740, a counter component included in the apparatus can output the target continuous signal after counting a defined number of pulse widths equal to the defined number of bits. The counter component can count a defined pulse width based on detecting rising edges and/or falling edges of a pulse signal.

As used in this application, the terms "environment," "system," "engine," "module," "component," "architecture," "interface," "unit," and the like are intended to encompass an entity that includes either hardware, software, or a combination of hardware and software. Such an entity can be embodied in, or can include, for example, a signal processing device. In another example, the entity can be embodied in, or can include, an apparatus with a defined functionality provided by optical parts, mechanical parts, and/or electronic circuitry. The terms "environment," "system," "engine," "module," "component," "architecture," "interface," and "unit" can be utilized interchangeably and can be generically referred to functional elements.

A component can be localized on one processing device or distributed between two or more processing devices. Components can communicate via local and/or remote architectures in accordance, for example, with a signal (either analogic or digital) having one or more data packets (e.g., data from one component interacting with another component in a local processing device, distributed processing devices, and/or across a network with other systems via the signal).

As yet another example, a component can be embodied in or can include an apparatus with a defined functionality provided by mechanical parts operated by electric or electronic circuitry that is controlled by a software application or firmware application executed by a processing device. Such a processing device can be internal or external to the apparatus and can execute at least part of the software or firmware application. Still in another example, a component can be embodied in or can include an apparatus that provides defined functionality through electronic components without mechanical parts. The electronic components can include signal processing devices to execute software or firmware that permits or otherwise facilitates, at least in part, the functionality of the electronic components. For the sake of illustration, an example of such processing device(s) includes an integrated circuit (IC), an application-specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed or otherwise configured (e.g., manufactured) to perform the functions described herein.

In some embodiments, components can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, components can communicate or otherwise be coupled via thermal, mechanical, electrical, and/or electromechanical coupling mechanisms (such as conduits, connectors, combinations thereof, or the like). An interface can include input/output (I/O) components as well as associated processors, applications, and/or other programming components.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The flowchart and block diagrams in the Figures illustrate the architecture, functionality, and operation of possible implementations of examples of systems, methods, and computer program products according to various embodiments of the present disclosure. In this regard, each block in the flowchart or block diagrams may represent a module, segment, or portion of instructions, which includes one or more machine- or computer-executable instructions for implementing the specified operations. It is noted that each block of the block diagrams and/or flowchart illustration, and combinations of blocks in the block diagrams and/or flowchart illustration, can be implemented by special purpose hardware-based devices that perform the specified functions or operations or carry out combinations of special purpose hardware and computer instructions.

What has been described herein in the present specification and annexed drawings includes examples of systems, apparatuses, devices, and techniques that, individually and in combination, permit generating programmable pulse signals using inverse chaotic maps, without reliance on a clocking signal. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

What is claimed is:

1. A method, comprising:
    receiving a sequence of bits having a defined number of bits, the sequence of bits representing a target continuous pulse width of a signal having a first defined width in a time-domain;
    receiving a precursor continuous pulse signal having a second defined width in the time-domain; and
    generating the target continuous pulse signal by transforming the precursor continuous pulse signal using the sequence of bits and an inverse chaotic map.

2. The method of claim 1, wherein the inverse chaotic map comprises an inverse chaotic tent map or a shift map having a first branch of operators and a second branch of operators, and wherein the sequence of bits determines one of the first branch or the second branch applied to input signals in a component.

3. The method of claim 1, wherein the target continuous pulse signal is represented with a precision determined by the defined number of bits.

4. The method of claim 1, wherein the target continuous pulse signal is transformed, in part, by a component that implements the inverse chaotic map, the component comprising at least one of a field programmable gate array (FPGA) or an application-specific integrated circuit (ASIC).

5. The method of claim 4, wherein the component includes first circuitry comprising,
    an AND gate that receives input signal and assembled to receive the sequence of bits;
    a SR-latch coupled to output of the AND gate; and
    an OR gate coupled to output of the SR-latch and assembled to receive a delayed input signal corresponding to the input signal delayed by a defined amount of time.

6. The method of claim 5, further comprising outputting, by a counter component, the target continuous pulse signal after counting a defined number of pulse widths equal to the defined number of bits.

7. The method of claim 4, wherein the component includes second circuitry comprising,
    first integrator circuitry that yields time-dependent output signal having a first defined slope;
    second integrator circuitry that yields time-dependent output signal having a second defined slope, wherein the first defined slope is a multiple of the second defined slope; and
    comparator circuitry that outputs a pulse signal having a defined width corresponding to a ratio between the second defined slope and the first defined slope.

8. The method of claim 4, wherein the transforming comprises iteratively transforming, by the component, by means of a time delay component, each bit in the sequence of bits and a respective prior output signal from the component that implements the inverse chaotic map.

9. An apparatus, comprising:
    a first component for receiving a sequence of bits having a defined number of bits, the sequence of bits representing a target continuous pulse signal having a first defined width in a time-domain;

a second component for receiving a precursor continuous pulse signal having a second defined width in the time-domain; and a third component for generating the target continuous pulse signal by transforming the precursor continuous pulse signal using the sequence of bits and an inverse chaotic map.

10. The apparatus of claim 9, wherein the transforming comprises iteratively transforming each bit in the sequence of bits and a respective prior output signal from an inverse chaotic map component.

11. The apparatus of claim 9, wherein the inverse chaotic map comprises an inverse chaotic tent map or a shift map having a first branch of operators and a second branch of operators, and wherein the sequence of bits determines one of the first branch or the second branch applied to input signals in the third component.

12. The apparatus of claim 9, further comprising a component for outputting the target continuous pulse signal after counting a defined number of pulse widths equal to the defined number of bits.

13. The apparatus of claim 9, wherein the target continuous pulse signal is represented with a precision determined by the defined number of bits.

14. An apparatus, comprising:

processing circuitry configured to perform operations comprising:

receiving a sequence of bits having a defined number of bits, the sequence of bits representing a target continuous pulse width of a signal having a first defined width in a time-domain;

receiving a precursor continuous pulse signal having a second defined width in the time-domain; and generating the target continuous pulse signal by transforming the precursor continuous pulse signal using the sequence of bits and an inverse chaotic map.

15. The apparatus of claim 14, wherein the inverse chaotic map comprises an inverse chaotic tent map or a shift map having a first branch of operators and a second branch of operators, and wherein the sequence of bits determines one of the first branch or the second branch applied to input signals in a component.

16. The apparatus of claim 14, wherein the target continuous pulse signal is represented with a precision determined by the defined number of bits.

17. The apparatus of claim 14, wherein the processing circuitry comprises a component that implements the inverse chaotic map, the component comprising at least one of a field programmable gate array (FPGA) or an application-specific integrated circuit (ASIC).

18. The apparatus of claim 17, wherein the component includes first circuitry comprising, an AND gate that receives input signal and assembled to receive the sequence of bits;

a SR-latch coupled to output of the AND gate; and an OR gate coupled to output of the SR-latch and assembled to receive a delayed input signal corresponding to the input signal delayed by a defined amount of time.

19. The apparatus of claim 17, wherein the component includes second circuitry comprising, first integrator circuitry that yields time-dependent output signal having a first defined slope;

second integrator circuitry that yields time-dependent output signal having a second defined slope, wherein the first defined slope is a multiple of the second defined slope; and comparator circuitry that outputs a pulse signal having a defined width corresponding to a ratio between the second defined slope and the first defined slope.

20. The apparatus of claim 17, wherein the processing circuitry further comprises a time delay component, and wherein the transforming comprises iteratively transforming, by the component, by means of the time delay component, each bit in the sequence of bits and a respective prior output signal from the component that implements the inverse chaotic map.

* * * * *